(12) United States Patent
Noda

(10) Patent No.: US 7,283,117 B2
(45) Date of Patent: Oct. 16, 2007

(54) SHIFT REGISTER AND DISPLAY DEVICE

(75) Inventor: Kazuhiro Noda, Kanagawa (JP)

(73) Assignee: Sony Corporation (JP)

( * ) Notice: Subject to any disclaimer, the term of this patent is extended or adjusted under 35 U.S.C. 154(b) by 511 days.

(21) Appl. No.: 10/780,748

(22) Filed: Feb. 19, 2004

(65) Prior Publication Data

US 2004/0164947 A1    Aug. 26, 2004

(30) Foreign Application Priority Data

Feb. 25, 2003  (JP)  ............................ P2003-046773

(51) Int. Cl.
*G09G 3/36* (2006.01)
(52) U.S. Cl. .................. 345/100; 345/96; 345/98; 345/99; 345/102
(58) Field of Classification Search .............. 345/87, 345/90, 92, 93, 96–100, 204, 208, 213, 209, 345/102, 94, 110; 257/292, 294; 365/185.22; 341/101; 235/487, 492
See application file for complete search history.

(56) References Cited

U.S. PATENT DOCUMENTS

| | | | | |
|---|---|---|---|---|
| 5,245,328 A * | 9/1993 | Garrett | .................. | 345/696 |
| 5,479,184 A * | 12/1995 | Tokumitsu | .................. | 345/3.1 |
| 5,590,074 A * | 12/1996 | Akaogi et al. | .................. | 365/185.22 |
| 5,798,742 A * | 8/1998 | Watatani et al. | .................. | 345/98 |
| 5,808,595 A * | 9/1998 | Kubota et al. | .................. | 345/92 |
| 6,407,418 B1 * | 6/2002 | Haga et al. | .................. | 257/294 |
| 6,456,267 B1 * | 9/2002 | Sato et al. | .................. | 345/92 |
| 6,512,505 B1 * | 1/2003 | Uchino et al. | .................. | 345/96 |
| 6,559,824 B1 * | 5/2003 | Kubota et al. | .................. | 345/100 |
| 6,630,920 B1 * | 10/2003 | Maekawa et al. | .................. | 345/100 |
| 6,670,944 B1 * | 12/2003 | Ishii | .................. | 345/100 |
| 6,686,899 B2 * | 2/2004 | Miyazawa et al. | .................. | 345/100 |
| 6,930,665 B2 * | 8/2005 | Sekine | .................. | 345/100 |
| 2002/0047827 A1 * | 4/2002 | Koyama et al. | .................. | 345/100 |
| 2002/0158833 A1 * | 10/2002 | Ho et al. | .................. | 345/100 |
| 2006/0071895 A1 * | 4/2006 | Miyazawa et al. | .................. | 345/92 |

FOREIGN PATENT DOCUMENTS

JP      11-134893      5/1999

* cited by examiner

*Primary Examiner*—Bipin Shalwala
*Assistant Examiner*—Prabodh Dharia
(74) *Attorney, Agent, or Firm*—Rader Fishman & Grauer PLLC; Ronald P. Kananan

(57) ABSTRACT

A shift register includes unit circuits cascade-connected to form a plurality of shift stages. Each of the unit circuits has a time-shifter including a NAND circuit to receive an input pulse as one input, and a holder having a PMOS transistor and a NMOS transistor, connected in series between a power supply and a clock input of which gates and drains are mutually connected in common respectively. The input of the holder is connected to the output of the NAND circuit, and the output thereof is fed as another input to the NAND circuit. The odd-stage unit circuits and the even-stage unit circuits operate in synchronism respectively with clock pulses having a ¼ phase difference from each other. In this structure, the number of transistors between the positive and negative power supplies can be reduced for lowering the required supply voltage and accelerating the shift register operation.

12 Claims, 6 Drawing Sheets

SHIFT REGISTER AND DISPLAY DEVICE

BACKGROUND OF THE INVENTION

The present invention relates to a shift register and a display device, and more particularly to a clock-inverter-type shift register constituting of clock(ed) inverters connected to form a multiplicity of stages, and also to an active matrix type display device using such a shift register in a portion of its peripheral driving circuit.

It has been known heretofore that, in a shift register employing a clock inverter, a basic circuit includes a clock inverter where four transistor elements are connected in series between a positive power supply and a negative power supply, and an input pulse is shifted and held synchronously with a clock pulse (e.g., see Patent Reference 1).

[Patent Reference 1]

Japanese Patent Laid-open No. Hei 11-134893 (particularly paragraphs 0018 to 0020, 0023 to 0025, and FIGS. 2 and 4).

Hereinafter a conventional shift register according to the related art will be described concretely reference to the accompanying drawings. FIG. 9 is a circuit diagram showing a circuit structure of one shift stage in the conventional shift register as a known example. As obvious from this diagram, one shift stage is composed of a unit circuit, which forms a pair of clock inverters 101, 102 and a next-stage inverter 103. A plurality of such shift stages are cascade-connected to constitute a shift register.

The clock inverter 101 is composed of a PMOS transistor Qp101 and an NMOS transistor Qn101 whose gates and drains are mutually connected in common respectively to thereby constitute a C-MOS inverter; a PMOS transistor Qp102 connected between the source of the PMOS transistor Qp101 and a positive power supply VDD, and receiving a clock pulse ck1 as a gate input; and an NMOS transistor Qn102 connected between the source of the NMOS transistor Qn101 and a negative power supply VSS, and receiving, as a gate input, a clock pulse ck1x, which is opposite in phase to the clock pulse ck1.

Similarly to the clock inverter 101, the clock inverter 102 is composed of MOS transistors Qp103 and Qn103 whose gates and drains are mutually connected in common respectively to thereby constitute a C-MOS inverter; a PMOS transistor Qp104 connected between the source of the PMOS transistor Qp103 and the positive power supply VDD, and receiving a clock pulse ck1x as a gate input; and an NMOS transistor Qn104 connected between the source of the NMOS transistor Qn103 and the negative power supply VSS, and receiving a clock pulse ck1 as a gate input.

In these clock inverters 101 and 102, the respective output ends are connected to each other, i.e., the drain common joint of the MOS transistors Qp101, Qn101 and the drain common joint of the MOS transistors Qp103, Qn103 are connected mutually. An input pulse st1 is fed to the input end of the clock inverter 101, i.e., to the gate common joint of the MOS transistors Qp101 and Qn101, and an output pulse out1 is obtained from the output end of the clock inverter 102.

The inverter 103 is composed of a PMOS transistor Qp105 and an NMOS transistor Qn105 whose gates and drains are mutually connected in common respectively to thereby constitute a C-MOS inverter. The input end of this inverter 103, i.e., the gate common joint of the MOS transistors Qp105 and Qn105, is connected to the output end of the clock inverter 102. The output end of the inverter 103, i.e., the drain common joint of the MOS transistors Qp103 and Qn103, is connected to the input end of the clock inverter 102, i.e., to the gate common joint of the MOS transistors Qp103 and Qn103.

FIG. 10 shows the timing relationship among the input pulse st1, the clock pulses ck1, ck1x and the output pulse out1. The input pulse st1 is taken into the clock inverter 101 during a high-level period (shift period) of the clock pulse ck1 and then is held by the clock inverter 102 and the inverter 103 during a high-level period (hold period) of the clock pulse ck1x, whereby the pulse st1 is shifted as an output pulse out1 to the next shift stage.

In the conventional shift register mentioned above as an example, each of the clock inverters 101 and 102 constituting a basic circuit includes many elements as four transistors between the power supplies VDD and VSS, and if the transistor size is enlarged for shortening the rise time or fall time of the shift pulse waveform, the input gate capacitance of each shift stage is increased, so that the transistor size needs to be more enlarged to enhance the driving capability for enabling the preceding shift stage to drive, whereby a faster operation of the shift register fails to be attained.

Further, there exists another problem that the performance is prone to be affected by variations in the threshold voltage Vth of each transistor, and it becomes difficult to lower the required supply voltage due to the threshold voltage Vth of the transistor itself. Assuming now that, for example, the threshold voltage Vth of the PchMOS transistor is 2.5V or so and the threshold voltage Vth of the NchMOS transistor is 1.0V to 1.5V or so, then the positive-side circuit starts an operation at 2.0V to 3.0V or so, while the negative-side circuit starts an operation at 5V or so, hence raising a further problem with regard to the operational symmetry on the positive and negative sides.

SUMMARY OF THE INVENTION

The present invention has been accomplished in view of the above problems. It is an object of the invention to provide a shift register wherein the number of transistor elements between the positive and negative power supplies is reduced to thereby lower the required supply voltage and to realize a faster operation of the shift register.

Another object of the present invention resides in providing a display device employing such a shift register in a portion of its peripheral driving circuit.

According to one aspect of the present invention, there is provided a shift register constituting of a plurality of unit circuits. Each of the unit circuits has a shifter including a NAND circuit to receive an input pulse as one input thereof, and a holder having a PMOS transistor and an NMOS transistor, which are connected in series between a power supply and a clock input end fed with a clock pulse and of which gates and drains are mutually connected in common respectively, wherein the input end of the holder is connected to the output end of the NAND circuit, and the output potential thereof is fed as another input to the NAND circuit. In the shift register having such a structure, the unit circuits are cascade-connected to form a plurality of stages.

According to another aspect of the present invention, there is provided a display device having a plurality of pixels arrayed two-dimensionally, and a scanner for selecting each of the plural pixels column by column or row by row. In this display device, the shift register of such a structure is employed as the scanner.

In the shift register of the above structure or in the display device employing the shift register as its scanner, the shifter constituting of a NAND circuit receives an input pulse as one input thereof, and shifts the pulse to the holder in accordance with the output potential of the holder that serves as another input. The holder holds the shifted pulse in synchronism with a clock pulse, and then outputs the shifted pulse. That is, the holding function of the shift register is carried out by using the clock pulse itself. With regard to the NAND circuit constituting the shifter, it can be realized by cascade-connecting three transistors between the positive and negative power supplies.

BRIEF DESCRIPTION OF THE DRAWINGS

These and other objects of the invention will be seen by reference to the description, taken in connection with the accompanying drawing, in which.

DETAILED DESCRIPTION OF THE PREFERRED EMBODIMENTS

Hereinafter some preferred embodiments of the present invention will be described in detail with reference to the accompanying drawings.

First embodiment

Figure 1:
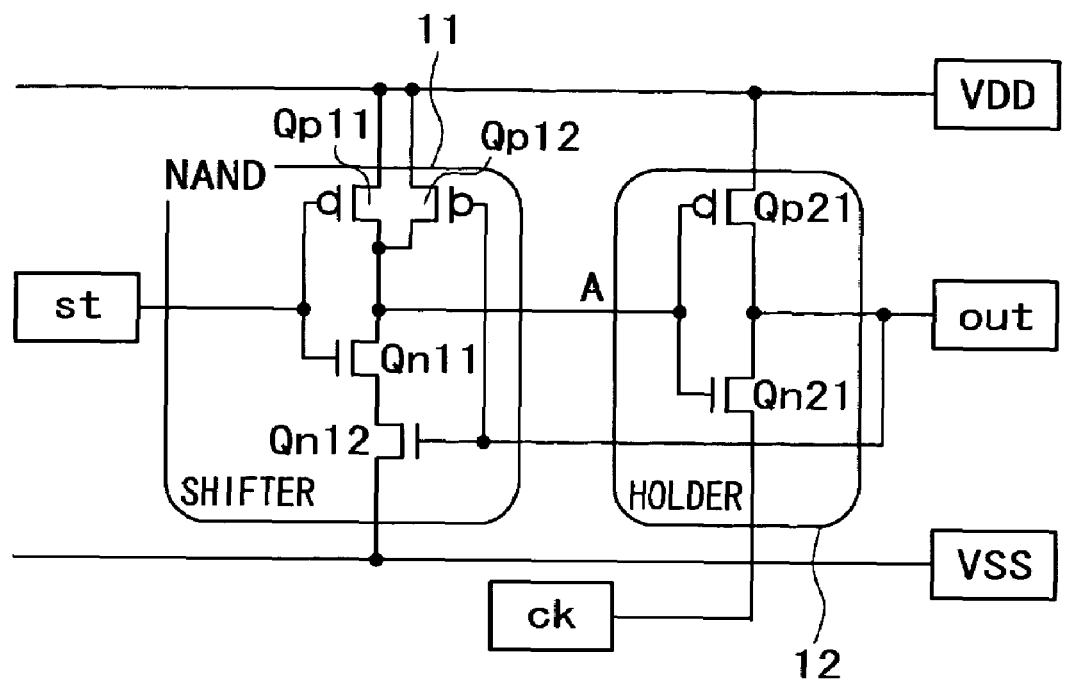
FIG. 1 is a circuit diagram showing a circuit structure of one shift stage in a shift register representing a first embodiment of the present invention.

FIG. 1 is a circuit diagram showing a circuit structure of one shift stage in a shift register representing a first embodiment of the present invention. In the shift register of this embodiment, each shift stage (unit circuit) has a shifter 11 to receive an input pulse st, and a holder 12 for holding the received pulse, wherein the shift register operation is performed synchronously with a single clock pulse ck.

The shifter 11 is composed of a NAND circuit in its structure. That is, the shifter 11 includes a PMOS transistor Qp11 whose drain is connected to a positive power supply VDD, a PMOS transistor Qp12 connected in parallel with the PMOS transistor Qp11, an NMOS transistor Qn11 whose drain is connected in common to the drains of these MOS transistors Qp11 and Qp12, and an NMOS transistor Qn1n whose drain is connected to the source of the NMOS transistor Qn11 and whose source is connected to a negative power supply VSS (or ground GND).

In this shifter 11, the gates of the PMOS transistor Qp11 and the NMOS transistor Qn11 are mutually connected in common, and an input pulse st is fed to this gate common joint. The gates of the PMOS transistor Qp12 and the NMOS transistor Qn1n are mutually connected in common, and an output potential of the holder 12 is applied to this gate common joint.

As obvious from FIG. 1, the NAND circuit can be realized by cascade-connecting the three transistors, i.e., MOS transistors Qp11 (Qp12), Qn11, and Qn12, between the positive power supply VDD and the negative power supply VSS (or GND). It is to be understood that the NAND circuit is not limited merely to the circuit structure shown as an example in FIG. 1, and any of various known circuit structures may be employed as well. In each of such various known circuit structures, the number of transistor elements between the power supplies VDD and VSS is three.

The holder 12 includes a PMOS transistor Qp21 whose drain is connected to the positive power supply VDD, and an NMOS transistor Qn21 whose gate and drain are mutually connected in common to the gate and the drain, respectively, of the PMOS transistor Qp21, wherein a clock pulse ck is fed to the source of the NMOS transistor Qn21.

In this holder 12, the gate common joint of the MOS transistors Qp21 and Qn21 is connected to the output end of the shifter 11, i.e., to the drain common joint of the MOS transistors Qp11, Qp12, and Qn11. Further, the output end of the holder 12, i.e., the drain common joint of the MOS transistors Qp21 and Qn21, is connected to the gate common joint of the MOS transistors Qp12 and Qn12 in the shifter 11, and the output potential is applied to this gate common joint.

Figure 2:
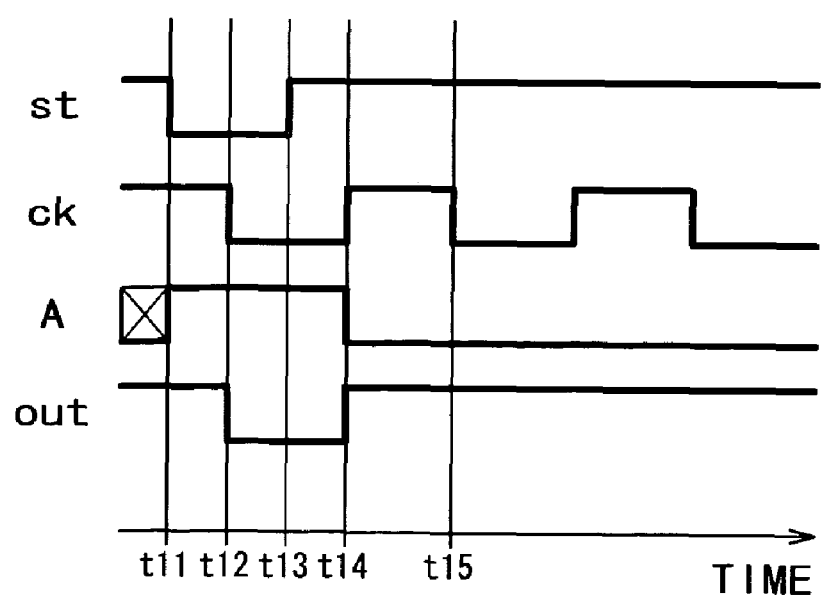
FIG. 2 is a timing chart for explaining the operation of the shift register in the first embodiment.

Now the circuit operation of one shift stage in the shift register of the first embodiment will be explained below with reference to a timing chart of FIG. 2. This timing chart of FIG. 2 shows the timing relationship among the input pulse st, the clock pulse ck, the output potential A from the shifter 11 (the input potential to the holder 12), and the output pulse out.

When the input pulse st transits, at time t11, from a high level (hereinafter referred to as "H" level) to a low level (hereinafter referred to as "L" level), the shifter 11 or the NAND circuit recognizes "L" level, so that the PMOS transistor Qp11 is turned on to thereby change the output potential A thereof to "H" level. The output potential A prior to the time t11 is in an indefinite state.

Next at time t12, the clock pulse ck transits from "H" level to "L" level, so that the source potential of the NMOS transistor Qn21 in the holder 12 is changed to "L" level and therefore the NMOS transistor Qn21 is turned on, whereby the output potential of the holder 12, i.e., the output pulse out, is caused to transit from "H" level to "L" level.

Subsequently at time t13, the input pulse st transits from "L" level to "H" level, but the output potential of the holder 12 is still at "L" level, so that the PMOS transistor Qp12 is kept in its on-state while the NMOS transistor Qn12 is kept in its off-state, whereby the output potential A of the shifter 11 is held at "H" level without any change.

Next at time t14, the clock pulse ck transits from "L" level to "H" level, so that the source potential of the NMOS transistor Qn21 in the holder 12 is changed to "H" level and therefore the NMOS transistor Qn21 is turned off, whereby the output pulse out is caused to transit from "L" level to "H" level. Consequently, the PMOS transistors Qp11 and Qp12 are both turned off while the NMOS transistor Qn12 is turned on, whereby the output potential A of the shifter 11 is caused to transit from "H" level to "L" level.

Thereafter at time t15, the clock pulse ck transits from "H" level to "L" level in the same manner as at time t12, but since the input pulse st is in its "H" level state, the PMOS transistors Qp11 and Qp12 are both turned off while the NMOS transistors Qn11 and Qn12 are both turned on. Consequently, the output potential A of the shifter 11 is in its "L" level state, so that the output pulse out is kept at "H" level.

In completion of such a series of steps mentioned above, the input pulse st taken into the shifter 11 is held in the holder 12, and after subsequent waveform shaping, there is performed a next operation of shifting the output pulse to the next shift stage. That is, out of the entire shift register functions, the holding function is not executed independently in the register, but the holding operation is performed by using the clock pulse ck itself (or some other pulse conforming therewith).

As described, each unit circuit (shift stage) is composed of the shifter 11 to realize a shift function by employing a NAND circuit, and the holder 12 to realize a holding function by using the clock pulse ck itself (or some other pulse conforming therewith), so that the transistor elements between the positive power supply VDD and the negative power supply VSS (or GND) can be numerically diminished to three, hence achieving a reduction of one element in comparison with four transistors employed in the related conventional art. Consequently, despite enlargement of the transistor size to shorten the rise time and the fall time in the shift pulse waveform, an increase in the input gate capacity of each shift stage can be suppressed to eventually ensure a faster shift register operation attained by enlarging the transistor size.

Further, since the number of the transistors is reduced by one, the required supply voltage can be lowered correspondingly to the threshold voltage Vth of each transistor. Assuming now that, in an example, the threshold voltage Vth of the PchMOS transistor is 2.5V or so and the threshold voltage Vth of the NchMOS transistor is 1.0V to 1.5V or so, then it becomes possible for the negative-side circuit to start the operation at 2.5V or so and for the positive-side circuit to start the operation at 2.0V to 3.0V or so, hence solving the problem with regard to the operational symmetry on the positive and negative sides.

Figure 3:
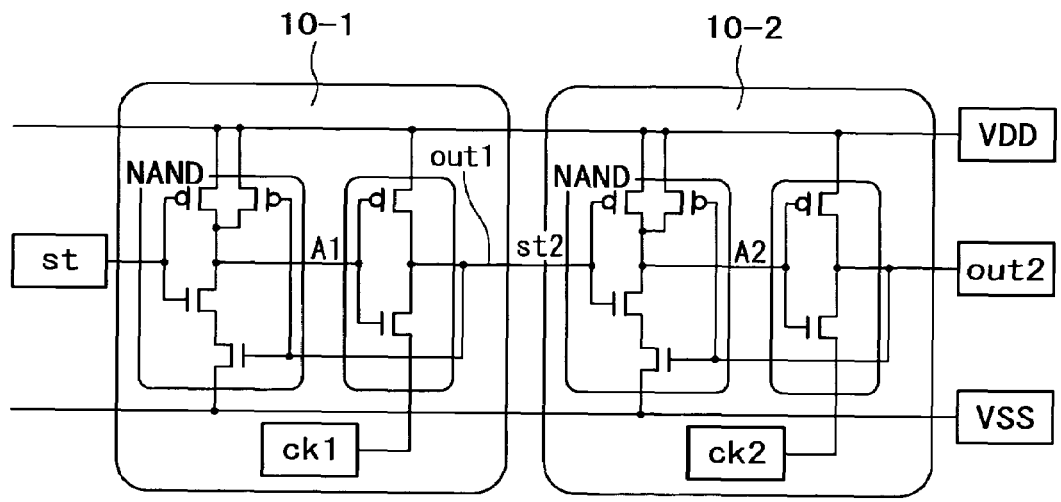
FIG. 3 is a circuit diagram showing a structure where two unit circuits are cascade-connected to form two shift stages in the first embodiment.
Figure 4:
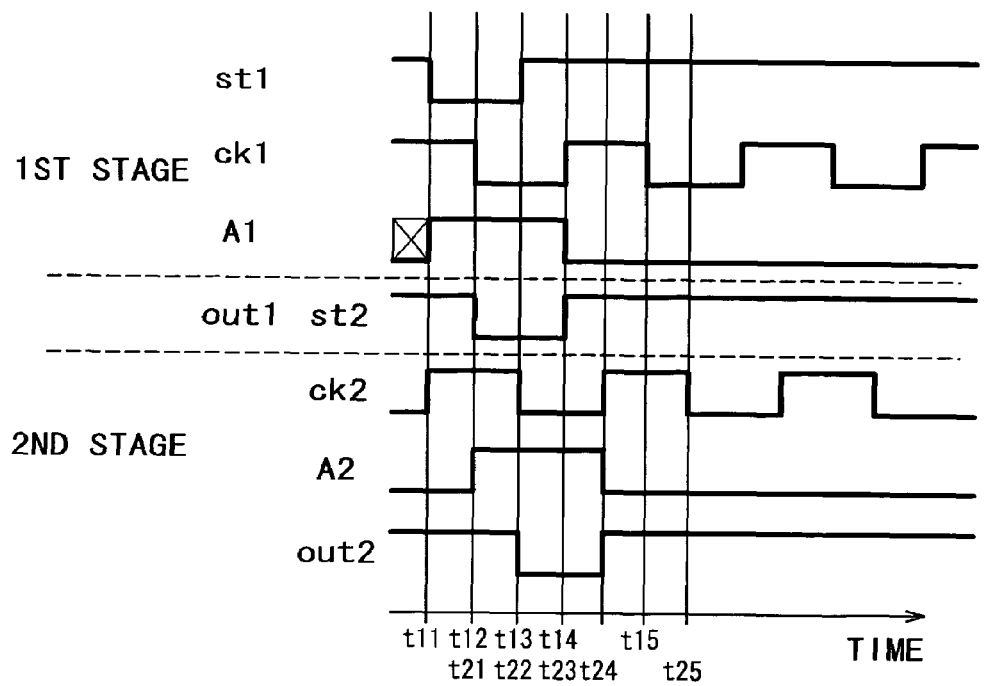
FIG. 4 is a timing chart for explaining the operation of the shift register with two cascade-connected shift stages.

FIG. 3 is a circuit diagram showing a structural example of a shift register where the shift stages (unit circuits) of the above structure are connected to form a multiplicity of stages. FIG. 4 is a timing chart in such a multi-stage connection.

As obvious from FIG. 3, in the case of a multi-stage connection (two-stage connection in this example), the shift stages (unit circuits) 10 (10-1, 10-2) of the above-described structure are cascade-connected, wherein an output pulse out1 obtained from the 1st shift stage 10-1 is fed as an input pulse st2 to the 2nd shift stage 10-2, and clock pulses ck1 and ck2 having a ¼ phase difference from each other are fed to the 1st shift stage 10-1 and the 2nd shift stage 10-2 respectively, hence enabling a shift register operation.

In the timing chart of FIG. 4, the operation timing t11 to t15 of the 1st shift stage 10-1 corresponds to the operation timing t11 to t15 in FIG. 2, and the operation timing t21 to t25 of the 2nd shift stage corresponds to the operation timing t11 to t15 in FIG. 2.

The above example represents a two-stage connection. In the case of a three or more-stage connection, shift stages may be cascade-connected as in the foregoing example, and clock pulses ck1 and ck2 may be fed to odd shift stages 10-1, 10-3, . . . and even shift stages 10-2, 10-4, . . . respectively. However, when the clock pulse ck1 is fed to the 1st, 5th, . . . stages in the odd shift stages 10-1, 10-3, . . . , a clock pulse ck1x opposite in phase to the clock pulse ck1 is fed to the 3rd, 7th, . . . stages respectively. Similarly, when the clock pulse ck2 is fed to the 2nd, 6th, . . . stages in the even shift stages 10-2, 10-4, . . . , a clock pulse ck2x opposite in phase to the clock pulse ck2 is fed to the 4th, 8th, . . . stages respectively. In each case, there exists no alteration in that the clock pulses ck1 and ck2 having a ¼ phase difference from each other are fed to the odd shift stages 10-1, 10-3, . . . and the even shift stages 10-2, 10-4, . . . respectively.

Second Embodiment

Figure 5:
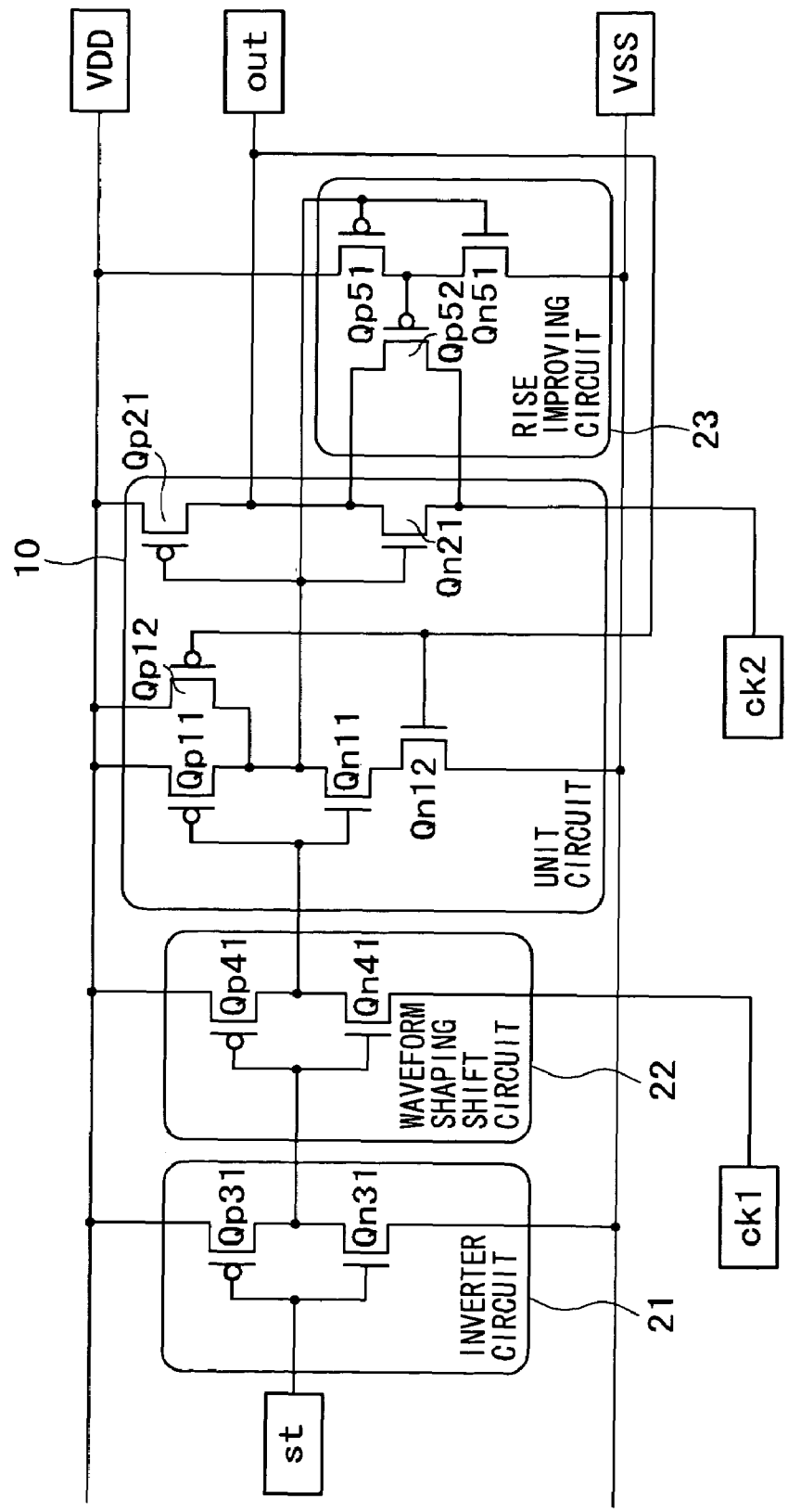
FIG. 5 is a circuit diagram showing a circuit structure of one shift stage in a shift register representing a second embodiment of the present invention.

FIG. 5 is a circuit diagram showing a circuit structure of one shift stage in a shift register representing a second embodiment of the present invention. In this diagram, any component parts corresponding to those in FIG. 1 are denoted by like reference numerals or symbols. In the shift register of this second embodiment, its fundamental structure is based on the shift register of the first embodiment. That is, in addition to the unit circuit (shift stage) 10 in the first embodiment, there are further included an inverter circuit 21, a waveform shaping shift circuit 22, and a rise improving circuit 23.

The inverter circuit 21 serves to take logic matching by eliminating any harmful influence of the preceding shift stage, and it is composed of a PMOS transistor Qp31 and an NMOS transistor Qn31 connected in series between a positive power supply VDD and a negative power supply VDD (or ground GND). The gates and the drains of these MOS transistors Qp31 and Qn31 are connected in common respectively to constitute a C-MOS inverter. An input pulse st is fed to the gate common joint of the MOS transistors Qp31 and Qn31.

The waveform shaping shift circuit 22 serves to shift the input pulse st, which is received via the inverter circuit 21, to the unit circuit 10 after processing the received pulse through waveform shaping. This circuit 22 includes a PMOS transistor Qp41 whose drain is connected to the positive power supply VDD, and an NMOS transistor Qn41 whose gate and drain are connected in common respectively to the gate and drain of the PMOS transistor Qp41, wherein a clock pulse ck1 is fed to the source of the NMOS transistor Qn41.

In this waveform shaping shift circuit 22, its input end, i.e., the gate common joint of the MOS transistors Qp41 and Qn41, is connected to the output end of the inverter circuit 21, i.e., to the drain common joint of the MOS transistors Qp31 and Qn31; and its output end, i.e., the drain common joint of the MOS transistors Qp41 and Qn41, is connected to the input end of the unit circuit 10, i.e., to the gate common joint of the MOS transistors Qp11 and Qn11.

The rise improving circuit 23 serves to improve the rise of an output pulse out. This circuit 23 includes a PMOS transistor Qp51 and an NMOS transistor Qn51 connected in series between the positive power supply VDD and the negative power supply VSS (or GND), and a PMOS transistor Qp52 connected in parallel to the NMOS transistor Qn21 in the unit circuit 10.

In the rise improving circuit 23, the gates and the drains of the MOS transistors Qp51 and Qn51 are connected in common respectively to constitute a C-MOS inverter. The gate common joint of the MOS transistors Qp51 and Qn51 is connected to the gate common joint of the MOS transistors Qp21 and Qn21 in the unit circuit 10. The gate of the PMOS transistor Qp52 is connected to the drain common joint of the MOS transistors Qp51 and Qn51.

In the shift register of the second embodiment having the above structure, a clock pulse ck1 is fed to the source of the NMOS transistor Qn41 in the waveform shaping shift circuit 22, while a clock pulse ck2 having a ¼ phase difference from the clock pulse ck1 is fed to the source of the NMOS transistor Qn21 in the unit circuit 10.

Now an explanation will be given on the circuit operation of the waveform shaping shift circuit 22. As the waveform shaping shift circuit 22 operates in accordance with the clock pulse ck1, the input pulse fed to the waveform shaping shift circuit 22 is shaped in waveform, and the pulse thus processed is shifted to the unit circuit 10 of the next stage. Due to such waveform shaping performed by the waveform shaping shift circuit 22, the input pulse st is so shaped as to be steep in its rise and fall, and then is inputted to the unit circuit 10, hence improving the frequency characteristic of the unit circuit 10. The phase of the pulse is inverted with its passage through the waveform shaping shift circuit 22.

In consideration of such phase inversion, the inverter circuit 21 is provided to achieve logic matching of the pulse waveform. That is, since the inverter circuit 21 inverts the phase of the input pulse st, an in-phase pulse with respect to the input pulse st can be fed to the unit circuit 10 despite the existence of the waveform shaping shift circuit 22, which causes phase inversion prior to the unit circuit 10. However, the inverter circuit 21 is not a requisite. More specifically, even without the inverter circuit 21, an in-phase pulse with respect to the input pulse st can still be fed to the unit circuit 10 by feeding a clock pulse ck1x, which is opposite in phase to the clock pulse ck1, to the source of the NMOS transistor Qn41 in the waveform shaping shift circuit 22.

Next, an explanation will be given on the circuit operation of the rise improving circuit 23. First, the unit circuit 10 is so formed that a clock pulse ck2 is fed to the circuit 23 via the NMOS transistor Qn21, whereby the rise characteristic of the output pulse out is deteriorated due to the NMOS transistor Qn21. Therefore, the rise improving circuit 23 is provided to improve such rise characteristic.

In this rise improving circuit 23, a PMOS transistor Qp52 connected in parallel to the NMOS transistor Qn21 of the unit circuit 10 constitutes a C-MOS transfer gate-gate (transmission gate) in combination with the NMOS transistor Qn21. The clock pulse ck2 is fed via this C-MOS transfer gate-gate, so that the PMOS transistor Qp52 responds momentarily to the rise of the clock pulse ck2, whereby the rise characteristic of the output pulse out can be improved in comparison with the known case where the clock pulse ck2 is fed merely via the NMOS transistor Qn21 alone.

Here, the C-MOS inverter constituting of the MOS transistors Qp51 and Qn51 is provided for feeding a pulse, which is opposite in phase to the pulse fed to the gate of the NMOS transistor Qn21, to the gate of the PMOS transistor Qp52. Therefore, if the structure is so contrived that the pulse opposite in phase to the pulse fed to the gate of the NMOS transistor Qn21 can be generated separately and then is fed to the gate of the PMOS transistor Qp52, it becomes possible to omit the C-MOS inverter constituting of the MOS transistors Qp51 and Qn51.

As described above, in the shift register of the second embodiment, its fundamental structure is based on the shift register of the first embodiment, and there are further included the waveform shaping shift circuit 22 and the rise improving circuit 23, so that the following advantageous functional effect is attainable in addition to the effect achieved in the shift register of the first embodiment. That is, the frequency characteristic can be enhanced by the function of the waveform shaping shift circuit 22, and the rise characteristic of the output pulse out can be improved by the function of the rise improving circuit 23.

Figure 6:
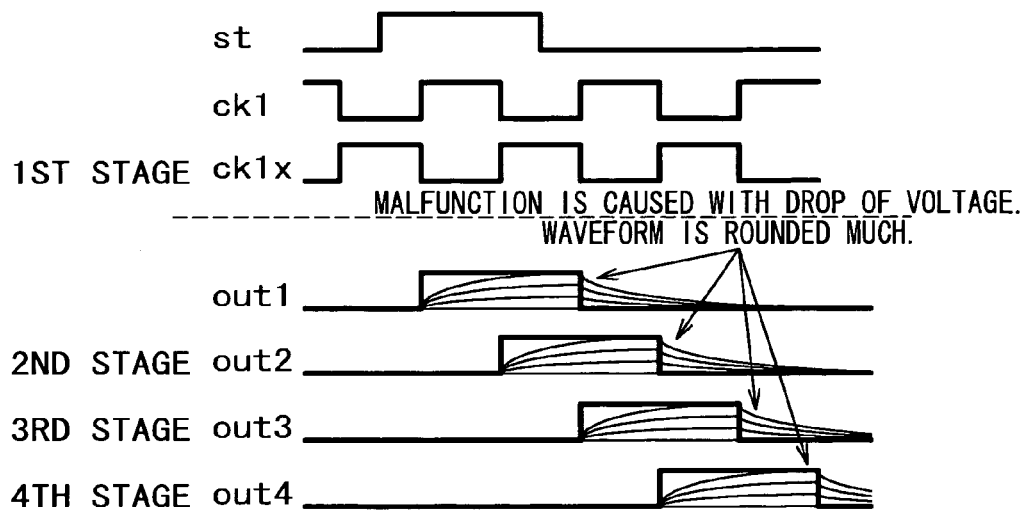
FIG. 6 is a timing chart for explaining the operation of a conventional shift register where multiple shift stages are connected.

Similarly to the shift register of the first embodiment, the shift register of the second embodiment is also used in the form of a multi-stage connection. Now, the shift register of a multi-stage connection according to the second embodiment will be compared below with the conventional shift register of a multi-stage connection according to the related art. In the conventional shift register of a multi-stage connection where four transistors are provided between the power supplies VDD and VSS, as obvious from the timing chart of FIG. 6, a malfunction is caused with a drop of the supply voltage, and the waveform is rounded much to consequently bring about difficulties in lowering the required supply voltage and achieving a faster operation of the shift register.

Figure 7:
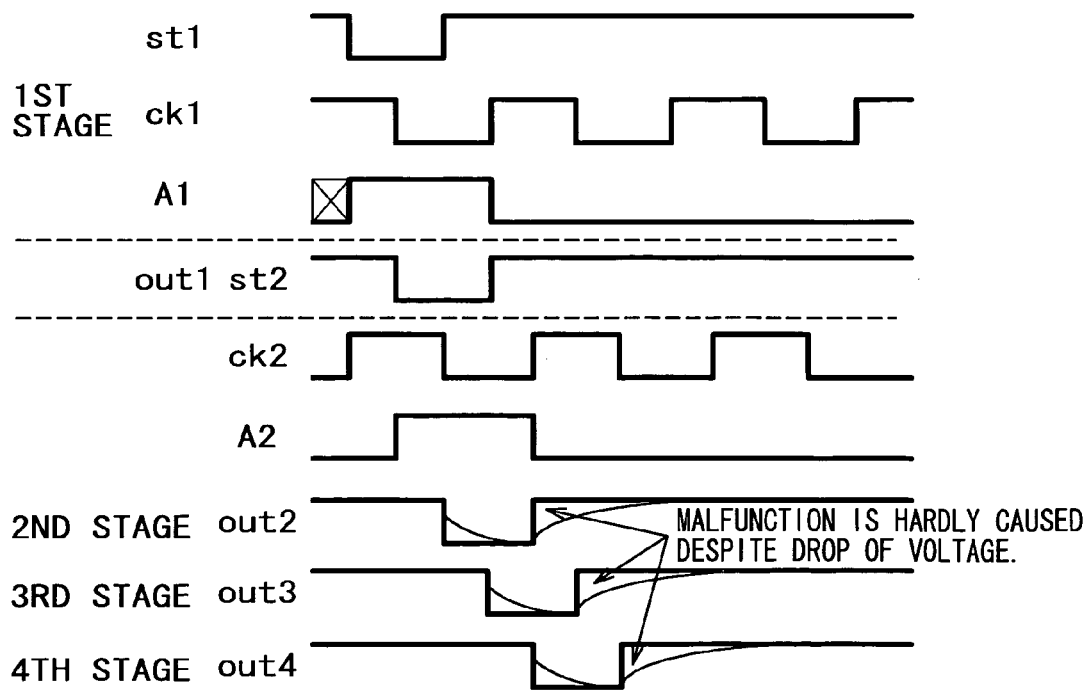
FIG. 7 is a timing chart for explaining the operation of a multi-stage connected shift register according to the second embodiment.

Meanwhile in the shift register of a multi-stage connection according to this embodiment where three transistors are provided between the power supplies VDD and VSS, as obvious from a timing chart of FIG. 7, a malfunction is hardly caused despite a drop of the supply voltage, and the data can be transferred even at a low supply voltage of, e.g., 5.5V or so with little rounding of the waveform. Therefore, in comparison with the conventional shift register of a multi-stage connection, it becomes possible to lower the required supply voltage and to realize a faster shift register operation.

EXAMPLE OF APPLICATION

The shift register of each embodiment mentioned above is applicable adaptively as a portion of a peripheral driving circuit in an active-matrix-type display device, e.g., as a scanner of a horizontal driving circuit or a vertical driving circuit in an active-matrix-type liquid crystal display device using liquid crystal cells as pixel display elements.

Figure 8:
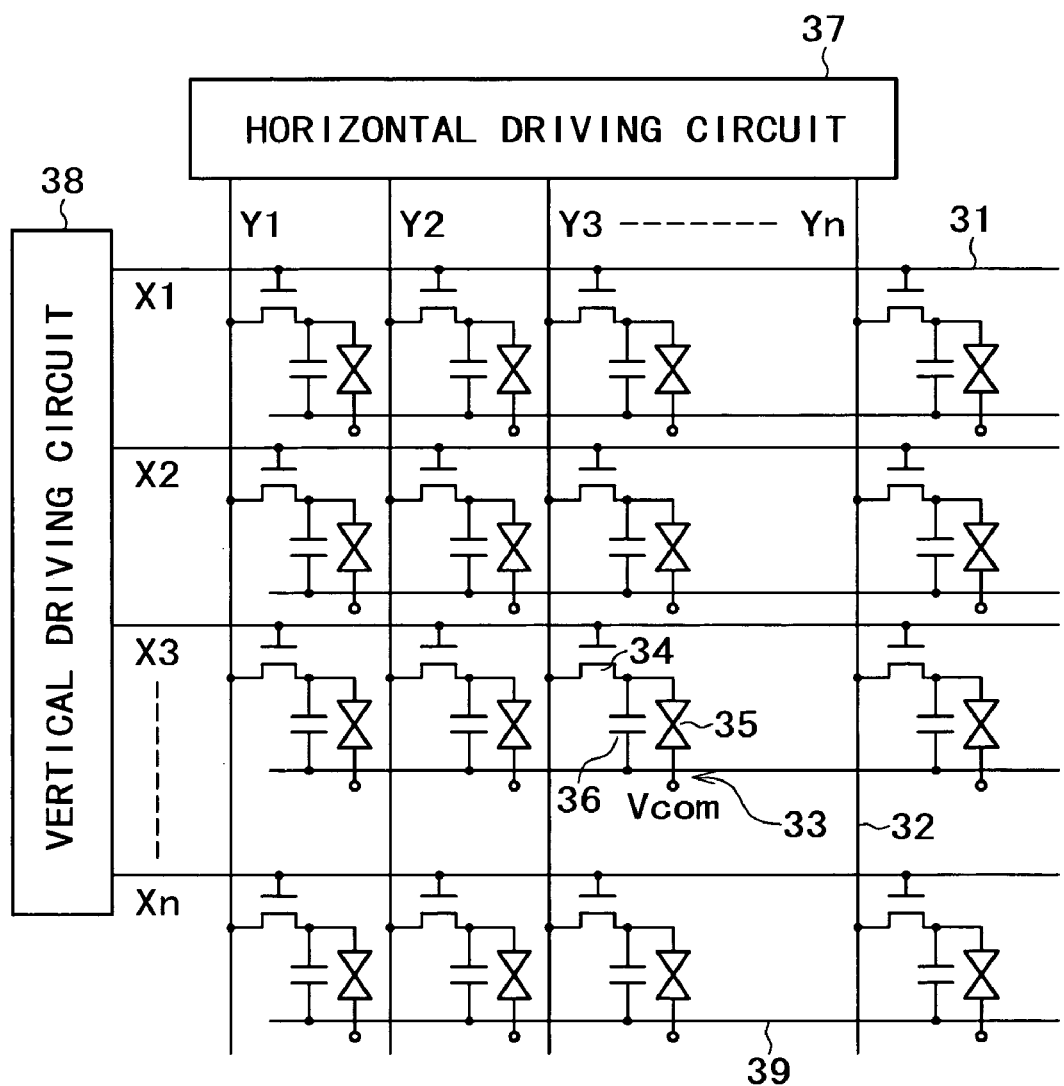
FIG. 8 is a circuit diagram showing a structural example of an active matrix type liquid crystal display device where the shift register of the present invention is applied.
Figure 9:
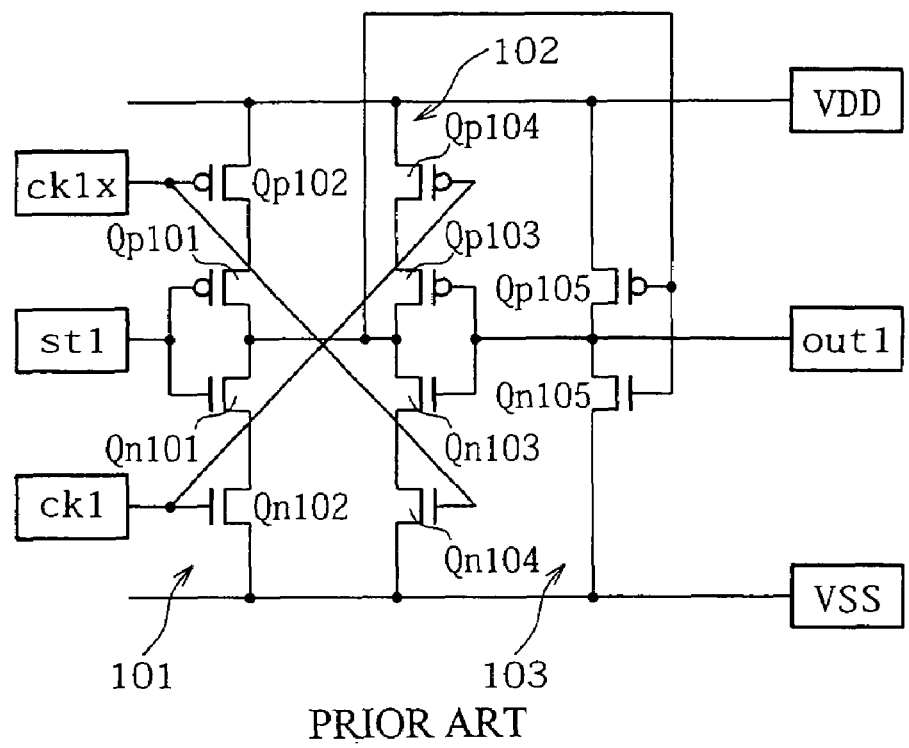
FIG. 9 is a circuit diagram showing the structure of a conventional clock inverter type shift register.
Figure 10:
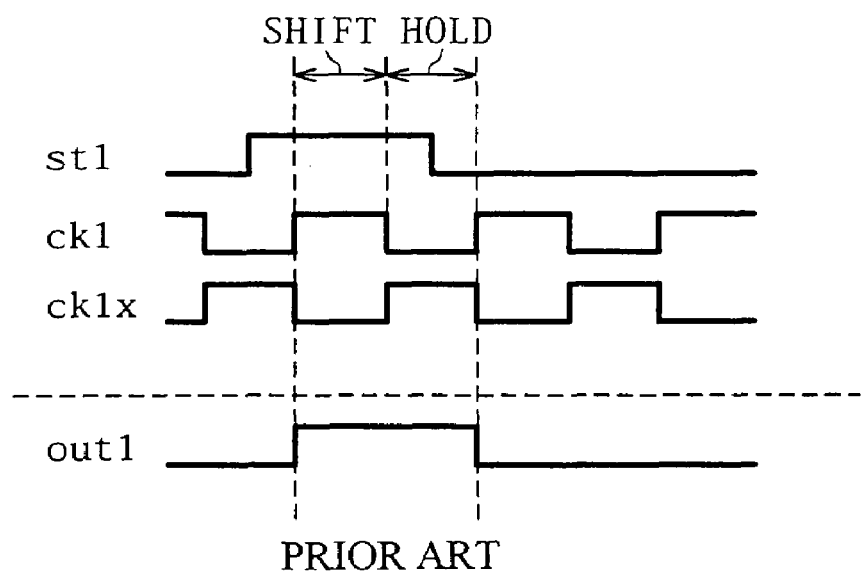
FIG. 10 is a timing chart for explaining the operation of the conventional clock inverter type shift register.

FIG. 8 is a circuit diagram showing a structural example of an active-matrix-type liquid crystal display device where the shift register of the present invention is applied. In FIG. 8, a plurality of pixels 33 are arrayed two-dimensionally at the respective intersections of a plurality of scanning lines 31 in rows and a plurality of signal lines 32 in columns.

Each of the plural pixels 33 includes a pixel transistor such as a TFT (Thin Film Transistor) 34 whose gate electrode and source electrode are connected respectively to the scanning line 31 and the signal line 32; a liquid crystal cell 35 whose pixel electrode is connected to the drain electrode of the corresponding TFT 34; and a holding capacitance 36 whose one electrode is connected to the drain electrode. A common potential Vcom is applied to the counter electrode of the liquid crystal cell 35 in common with regard to each pixel. The other electrode of the holding capacitance 36 is connected to a CS line 39 in common with regard to each pixel.

Each of the plural pixels 33 is selected, one-by-one by means of a horizontal driving circuit 37 to select and drive a column of the pixels and a vertical driving circuit 38 to select and drive a row of the pixels, and then a signal is written from the horizontal driving circuit 37 via the signal line 32. The horizontal driving circuit 37 and the vertical driving circuit 38 have a scanner therein to perform progressive scanning in the horizontal and vertical directions, and the shift register of the above-described embodiment is employed as this scanner.

Thus, in the active-matrix-type liquid crystal display device, the shift register according to the above embodiment is used to serve as a scanner in a portion of its peripheral driving circuit such as, e.g., the horizontal driving circuit 37 or the vertical driving circuit 38, whereby the shift register is enabled to lower the required driving supply voltage and to accelerate the shift register operation, hence lowering the required supply voltage of the liquid crystal display device itself and further increasing the display speed thereof.

In this example, an explanation has been given of an exemplary case of applying the shift register of the present invention to a scanner in a liquid crystal display device employing a liquid crystal cell as each pixel display element. However, it is to be understood that the application is not limited merely to the scanner in such a liquid crystal display device alone, and the shift register is applicable also to a scanner in any of the general active-matrix-type display devices, such as an EL (electroluminescence) display device using EL elements as its pixel display elements.

Further, the application of the present invention is not limited only to the shift register employed as a scanner in a display device, but also may be applied to a shift register used as a scanner in an X-Y address type solid state image sensor represented by a CMOS imager, for example.

According to the present invention, as mentioned hereinabove, a shift function can be realized by means of a NAND circuit, and a holding function can be realized by using a clock pulse itself (or some other pulse conforming therewith), hence lowering the required supply voltage and accelerating the shift register operation.

What is claimed is:

1. A shift register including a plurality of unit circuits each having:
   a time-shifter comprising a NAND circuit to receive an input pulse as one input thereof; and
   a holder having a PMOS transistor and an NMOS transistor, which are connected in series between a power supply and a clock input end fed with a clock pulse and of which gates and drains are mutually connected in common respectively, wherein the input end of said holder is connected to the output end of said NAND circuit, and the output potential thereof is fed as another input to said NAND circuit.

2. The shift register according to claim 1, wherein said unit circuits are cascade-connected to form a plurality of stages, and the odd-stage unit circuits and the even-stage unit circuits operate in synchronism respectively with clock pulses having a ¼ phase difference from each other.

3. The shift register according to claim 1, further having a PMOS transistor connected in parallel with the NMOS transistor in said holder and receiving, as a gate input thereto, a pulse opposite in phase to the input pulse fed to said holder.

4. The shift register according to claim 3, further having an inverter circuit, which inverts the phase of the input pulse fed to said holder and then feeds the phase-inverted pulse to the gate of said PMOS transistor.

5. The shift register according to claim 1, further having a waveform shaping shift circuit, which shapes the waveform of the input pulse in synchronism with the clock pulse having a ¼ phase difference from the clock pulse fed to said holder, and then feeds the waveform-shaped pulse to said shifter.

6. The shift register according to claim 5, further having an inverter circuit for inverting the phase of said input pulse and feeding the phase-inverted pulse to said waveform shaping shift circuit.

7. A display device having:
   a plurality of pixels arrayed two-dimensionally; and a scanner for selecting each of said plural pixels column by column or row by row;
   wherein said scanner is composed of a shift register comprising a plurality of unit circuits cascade-connected to form a plurality of stages, each unit circuit having:
   a time-shifter comprising a NAND circuit to receive an input pulse as one input thereof; and a holder having a PMOS transistor and an NMOS transistor, which are connected in series between a power supply and a clock input end fed with a clock pulse and of which gates and drains are mutually connected in common respectively, wherein the input end of said holder is connected to the output end of said NAND circuit, and the output potential thereof is fed as another input to said NAND circuit; and the odd-stage unit circuits and the even-stage unit circuits operate in synchronism respectively with clock pulses having a ¼ phase difference from each other.

8. The display device according to claim 7, further having a PMOS transistor connected in parallel with the NMOS transistor in said holder and receiving, as a gate input thereto, a pulse opposite in phase to the input pulse fed to said holder.

9. The display device according to claim 8, further having an inverter circuit, which inverts the phase of the input pulse fed to said holder and then feeds the phase-inverted pulse to the gate of said PMOS transistor.

10. The display device according to claim 7, further having a waveform shaping shift circuit, which shapes the waveform of the input pulse in synchronism with the clock pulse having a ¼ phase difference from the clock pulse fed to said holder, and then feeds the waveform-shaped pulse to said shifter.

11. The display device according to claim 10, further having an inverter circuit for inverting the phase of said input pulse and feeding the phase-inverted pulse to said waveform shaping shift circuit.

12. The display device according to claim 7, wherein said plurality of pixel display elements are liquid crystal cells.

* * * * *